United States Patent
Ghantasala et al.

(10) Patent No.: US 10,607,815 B2
(45) Date of Patent: Mar. 31, 2020

(54) METHODS AND APPARATUSES FOR PLASMA CHAMBER MATCHING AND FAULT IDENTIFICATION

(71) Applicant: Applied Materials, Inc., Santa Clara, CA (US)

(72) Inventors: Sathyendra Ghantasala, Fremont, CA (US); Hyun-Ho Doh, San Ramon, CA (US); Vijayakumar C. Venugopal, Berkeley, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 167 days.

(21) Appl. No.: 16/023,963

(22) Filed: Jun. 29, 2018

(65) Prior Publication Data
US 2020/0006039 A1    Jan. 2, 2020

(51) Int. Cl.
  *H01J 7/24*  (2006.01)
  *H05B 31/26*  (2006.01)
  *H01J 37/32*  (2006.01)

(52) U.S. Cl.
  CPC .. *H01J 37/32183* (2013.01); *H01J 37/32458* (2013.01); *H01J 37/32926* (2013.01); *H01J 2237/332* (2013.01); *H01J 2237/334* (2013.01); *H01J 2237/335* (2013.01)

(58) Field of Classification Search
  None
  See application file for complete search history.

(56) References Cited

U.S. PATENT DOCUMENTS

| | | | |
|---|---|---|---|
| 7,169,625 B2 | 1/2007 | Davis et al. | |
| 7,813,895 B2 | 10/2010 | Tallavarjula et al. | |
| 2014/0265851 A1* | 9/2014 | Albarede | H01J 37/32899 315/111.21 |
| 2014/0349417 A1* | 11/2014 | O'Neill | H01L 22/12 438/5 |
| 2018/0158652 A1 | 6/2018 | Shinagawa | |
| 2018/0158657 A1 | 6/2018 | Shinagawa | |

* cited by examiner

*Primary Examiner* — Anh Q Tran
(74) *Attorney, Agent, or Firm* — Patterson + Sheridan LLP

(57) ABSTRACT

Methods of operating and assembling a plasma chamber are disclosed. An operating method includes tuning a match network of a plasma chamber while running a non-plasma discharge recipe. A hardware impedance of the plasma chamber is calculated from the match network settings from the tuning. A match loss for the plasma chamber is also calculated according to match network settings. A radio frequency (RF) power setting for the first plasma chamber is set according to the calculated hardware impedance and the calculated match loss. Such methods can be utilized to provide chamber-to-chamber performance matching across different plasma chambers. Certain disclosed methods of operating the plasma chamber can be utilized to identify hardware faults during operation and/or assembly processes.

20 Claims, 5 Drawing Sheets

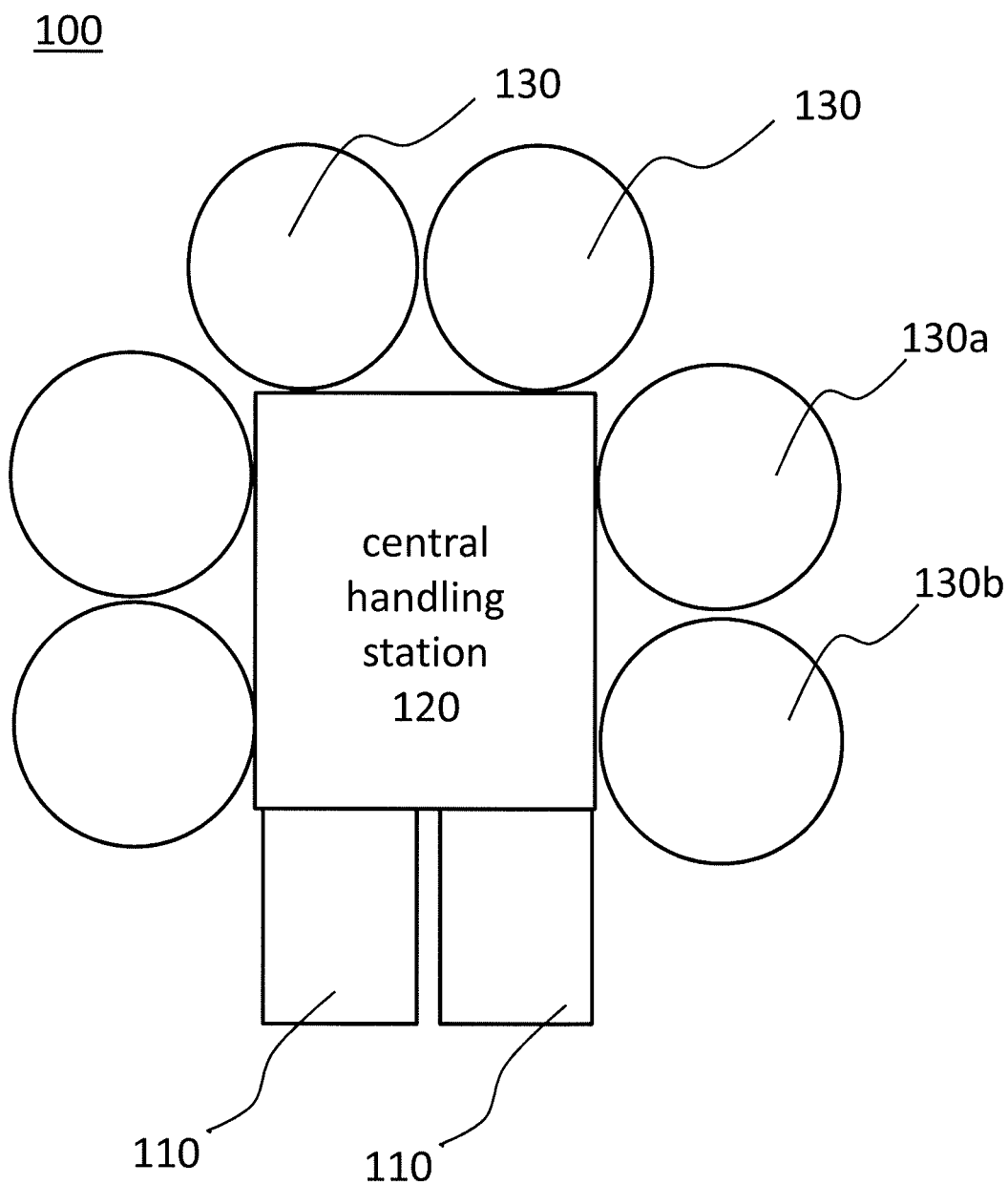

```
┌─────────────────────────────────────┐
│ Establish no plasma discharge       │ ~310
│ recipe(s) for a plasma chamber      │
└─────────────────────────────────────┘
                 ↓
┌─────────────────────────────────────┐
│ Tune plasma chamber match network   │ ~320
│ during running of no plasma         │
│ discharge recipe(s)                 │
└─────────────────────────────────────┘
                 ↓
┌─────────────────────────────────────┐
│ Calculate plasma chamber hardware   │ ~330
│ impendence (Z) according to match   │
│ results for plasma chamber          │
└─────────────────────────────────────┘
                 ↓
┌─────────────────────────────────────┐
│ Calculate match losses for plasma   │ ~340
│ chamber according to match results  │
│ for plasma chamber                  │
└─────────────────────────────────────┘
                 ↓
┌─────────────────────────────────────┐
│ Calculate a value for actual power  │
│ delivered to plasma in plasma       │
│ chamber based on calculated         │ ~350
│ hardware impendence (Z) and         │
│ calculated match losses (optional)  │
└─────────────────────────────────────┘
                 ↓
┌─────────────────────────────────────┐
│ Adjust plasma chamber generator     │ ~360
│ power setting according to          │
│ calculated actual power (optional)  │
└─────────────────────────────────────┘
```

METHODS AND APPARATUSES FOR PLASMA CHAMBER MATCHING AND FAULT IDENTIFICATION

BACKGROUND

Field

The present disclosure generally relates to plasma chambers, methods of operating such chambers, the provision of chamber-to-chamber matching for such chambers, and the identification of faults in the assembly of such chambers.

Description of the Related Art

Plasma chambers are used in a variety of semiconductor and related device fabrication processes, for example, plasma etching, plasma-enhanced deposition, and plasma-assisted cleaning. It is common to provide increased manufacturing throughput by using two or more chambers providing nominally the same processing and operated in parallel such that different substrates are processed in the different chambers in a manufacturing process flow. Given the often very tight process margins associated with the manufacture of semiconductor devices having nanometer-scale features, chamber-to-chamber process uniformity is usually very important, yet difficult to achieve, in multi-chamber process flows. Likewise, it is preferred that plasma chambers be returned quickly to a predetermined state after maintenance downtimes or the like.

SUMMARY

According to one embodiment, a method of operating a plasma chamber, comprises tuning a match network of a plasma chamber while running a non-plasma discharge recipe in the plasma chamber; calculating a hardware impedance of the plasma chamber according to match network settings set in the tuning; calculating a match loss for the plasma chamber according to match network settings set in the tuning; and setting a radio frequency (RF) power setting of the plasma chamber according to the calculated hardware impedance and the calculated match loss.

According to another embodiment, a method of operating a plasma chamber comprises: measuring electrical parameters of a plasma chamber while running a non-plasma discharge recipe to establish a baseline operating state of the plasma chamber; introducing a known fault in hardware of the plasma chamber; measuring electrical parameters of the plasma chamber after introduction of the known fault while running the non-plasma discharge recipe to establish a known fault operating state of the first plasma chamber; and comparing measured electrical parameters of the baseline operating state to measured electrical parameters of the known fault operating state and establishing a model correlating measured electrical parameters to the known fault operating state.

According to another embodiment, a method of assembling a plasma chamber comprises: obtaining a multivariate model correlating measured electrical parameters of a first plasma chamber running one or more non-plasma discharge recipe to hardware faults in the first plasma chamber; assembling a second plasma chamber; measuring electrical parameters of the second plasma chamber while running at least one non-plasma discharge recipe; and comparing the measured electrical parameters of the second plasma chamber to output of the multivariate model and identifying a hardware fault in the second plasma chamber according to the comparison.

BRIEF DESCRIPTION OF THE DRAWINGS

So that the manner in which the above recited features of the present disclosure can be understood in detail, a more particular description of the disclosure, briefly summarized above, may be had by reference to example embodiments, some of which are illustrated in the appended drawings. It is to be noted, however, that the appended drawings illustrate only certain example embodiments and are therefore not to be considered limiting of scope of the present disclosure, which may admit to many variations as other equally effective embodiments.

FIG. 2 depicts aspects of a multi-chamber plasma processing tool according to an embodiment.

FIG. 3 depicts aspects of a method of operating a plasma processing tool according to an embodiment.

Figure 1:
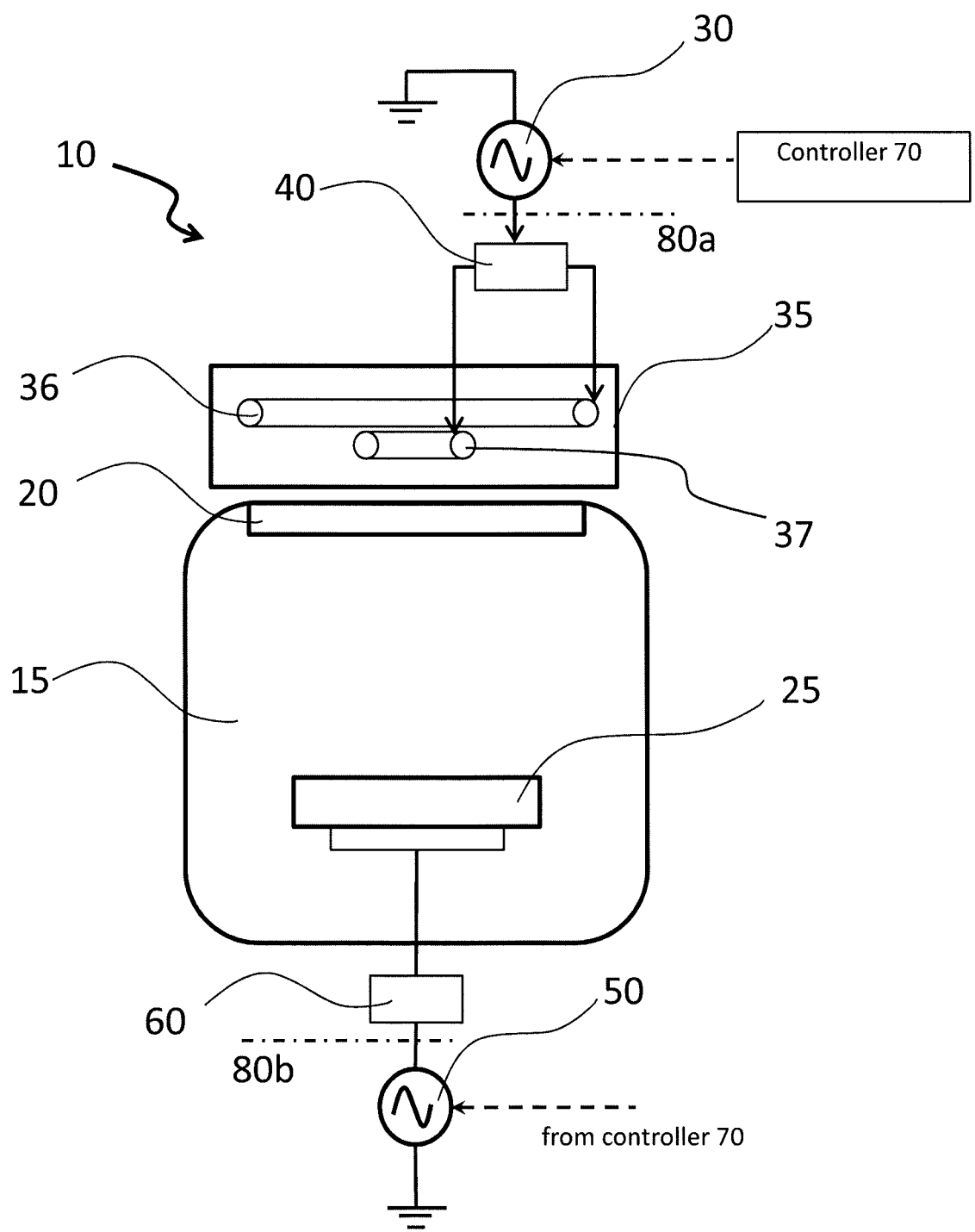
FIG. 1 depicts aspects of a plasma chamber according to an embodiment.

To facilitate understanding, identical reference numerals have been used, where possible, to designate elements that are common in the figures. It is contemplated that elements and features of any embodiment may be beneficially incorporated in other embodiments without further recitation of the particular combination.

DETAILED DESCRIPTION

The setting of the radio frequency (RF) power supplied to a plasma chamber is one of the primary control variables used in controlling plasma processes. However, any variations in the RF power actually delivered to plasma chambers during processing can cause variations in process results. For example, differences in RF power levels supplied to a plasma etch chamber may cause variations in etch rates and/or etch profiles on workpieces (e.g., silicon wafers used in the fabrication of semiconductor devices and the like) processed within the chamber. Likewise, any variations in those plasma chambers intended to provide substantially identical processing will cause chamber-to-chamber process variations.

Chamber-to-chamber variation refers, in this context, to any differences in process results (e.g., deposited film thicknesses, etch depths, etch profiles, feature roughness, etch feature critical dimension, or the uniformity of such aspects within dies and/or across a wafer) that occur amongst processing chambers that are notionally identical and performing nominally the same processing operation(s). Any chamber-to-chamber variation must be accounted for in device design margins and processing tolerances of the devices being fabricated using these chambers.

In general, existing control methods for RF power matching across different plasma chambers rely on sensors measuring power output from the RF generators of the chamber. These sensors are typically positioned along the RF pathway of the plasma chamber near the RF generator but before various hardware components of the plasma chamber that influence power delivery. In general, these sensors are unable to directly measure the RF power losses/variations related to chamber components such as the RF match networks, RE electrodes/coils, the dielectric window/lid, substrate supports, and the like. Thus, the RF power actually delivered to the plasma formed inside the plasma chamber is not precisely known since hardware variations downstream of the RF generator are ignored or otherwise assumed to be substantially the same for each of the notionally identical plasma chambers. These variations between notionally identical chambers must either be compensated for by individualized variations in operating parameters for each chamber or otherwise accounted for by increases in device design tolerances.

Some example embodiments of the present disclosure improve chamber-to-chamber matching by: 1) using particular diagnostic tests to estimate losses and variations in RF power delivery path not currently accounted for in standard systems; 2) using the results from diagnostic tests to identify specific chamber differences, such as those related to installation issues and/or out of specification parts; and 3) compensating for unavoidable chamber hardware variations by adjusting the RF generator power output as necessary to deliver the same RF power to plasmas in each chamber.

FIG. 1 depicts aspects of a plasma processing chamber 10. The plasma processing chamber 10 includes a vacuum chamber 15 including a dielectric window 20 and a workpiece support 25. The vacuum chamber 15 includes inlets and outlets via which gases can be introduced or removed. The vacuum chamber 15 may include additional components such as view ports, sensor ports, doors, hatches, and/or load locks. The dielectric window 20 may be an integrated portion of the vacuum chamber 15 in some embodiments or may be a distinct component that is affixed or mounted to the vacuum chamber 15.

High voltage RF power is used to form a plasma within the vacuum chamber 15 for the purposes of plasma processing, such as reactive ion etching, plasma-enhanced chemical vapor deposition, or plasma-assisted cleaning. This RF power is supplied by top generator 30 via upper electrode 35. In this example, upper electrode 35 includes at least an outer coil 36 and an inner coil 37. A matching network 40 is included between top generator 30 and upper electrode 35 so as to permit coupling of the RF power to the vacuum chamber 15.

The workpiece support 25 can include an electrostatic chuck, a vacuum chuck or the like. The workpiece is a silicon wafer, a semiconductor substrate, a glass plate or any other object to be subjected to a plasma processing. The workpiece support 25 can have a bias voltage applied thereto. Workpiece support 25 may be referred to as a cathode in some instances. Bottom generator 50 supplies a bias voltage to the workpiece support 25 via matching network 60. The matching network 60 permits coupling of the RF power to the vacuum chamber 15.

The controller 70 for the plasma processing chamber 10 can adjust the power output settings for the top generator 30 and the bottom generator 50. The controller 70 can also change or vary the operating mode of the upper electrode 35. For example, the controller 70 can control the ratio of the power split between to the coils. Controller 70 is configured to cause currents in the outer coil 36 and the inner coil 37 to flow in the same direction (e.g., both in a clockwise direction) or to flow in the opposite direction (e.g., one clockwise, one counterclockwise) as desired. The parallel and antiparallel directions of current flows the inner and outer coils of upper electrode 35 are controllable operating modes of the upper electrode 35.

FIG. 1 depicts power measurement points 80a and 80b along the RF power pathway of the plasma processing chamber 10. In general, controller 70 relies on the power measurements made at these points 80a and 80b for purposes of controlling the power supplied from the generators (top generator 30 and bottom generator 50). Such control fails to account for possible differences in the hardware of plasma processing chamber 10 that is inside these points 80a and 80b. That is, anything related to the materials, manufacturing, and/or installation of the matching network 40, upper electrode 35, dielectric window 20, workpiece support 25, or matching network 60 might remain unaccounted in the control scheme applied by controller 70.

While it is possible for operating conditions of any one plasma processing chamber 10 to be calibrated such that any particular variations in its hardware might be compensated, such an individualized process is difficult and time consuming. Furthermore, for purposes of chamber-to-chamber matching, every plasma processing chamber would have to be calibrated to some sort of shared, absolute standard.

FIG. 2 depicts an apparatus 100 according to an embodiment. Apparatus 100 is a multiple-chamber semiconductor processing tool, sometimes referred to as a cluster tool. Apparatus 100 includes two load locks 110 via which wafers can be inserted for processing or removed after processing. Load locks 110 may incorporate plasma-assisted cleaning functions in some examples. In this context, wafers are workpieces/substrates upon which fabrication process are performed in the apparatus 100. The wafers are, for example, 300 mm single crystal silicon wafers used in the manufacture of integrated circuit devices having nano-scale minimum feature sizes.

Central handling station 120 transfers and receives wafers from the load locks 110 and transfers single wafers to various chambers 130 for processing. The central handling station 120 can include various wafer handling mechanisms, such as a robot arm or arms. Once any particular processing of a wafer is completed in a chamber 130, the wafer is returned to central handling station 120.

In some process schemes, the wafer can then be transferred to a different chamber 130 within apparatus 100 for additional processing. For example, in a first chamber 130, a film of a first material can be deposited on the wafer. In a second chamber 130, a film of a second material can be deposited on the wafer. In other processing schemes, each chamber 130 might be performing nominally the same processing on wafers and each wafer might be processed in only one chamber 130 then removed from the apparatus 100. Other variations of the processing scheme includes performing different plasma etching processing in a series of different chambers 130.

Particular chambers 130 within apparatus 100 may be designed and/or operated as a plasma etching chamber, a chemical vapor deposition (CVD) chamber, a plasma-enhanced chemical vapor deposition (PEVCD) chamber, a plasma-assisted cleaning chamber, or the like. In this depicted example, at least two of the chambers 130 (130a and 130b) are plasma chambers corresponding in design to plasma chamber 10 described in conjunction with FIG. 1. Chamber 130a and chamber 130b are furthermore designed and operated to provide substantially identical processing.

For example, these chambers 130a and 130b are each plasma etching chambers used to perform reactive ion etching (RIE) on individual wafers to form patterns on the wafers having minimum feature sizes of about 10 nanometers (nm). In some examples, every chamber 130 within apparatus 100 is a plasma chamber 10 intended to provide substantial identical processing. Embodiments of the present disclosure provide improved methods for assembling and operating such chambers 130 so as to provide improved plasma processing performance.

Methods of Chamber Matching and Operation

As discussed in conjunction with FIG. 1, the differences in hardware components of plasma chamber 10 within the RF pathway can cause differences in delivery of RF power to the plasma during operation. Such differences may result from manufacturing defects or merely variations within otherwise acceptable manufacturing tolerance ranges for such hardware components. Even relatively minor differences in installation of substantially identical hardware during initial chamber assembly (or re-assembly after maintenance) can cause differences in delivery of RF power within plasma chamber 10.

Typically, various qualification tests and calibration runs are performed to diagnose issues in the RF delivery system of a just-assembled plasma chamber 10. However, RF sensor data obtained during standard versions of these qualification tests and runs are relatively sensitive to chamber conditions (e.g., chamber seasoning, moisture levels). Additionally, other variations outside of the RF delivery system/components may also be present and complicate the analysis. Thus, it is difficult to isolate the source(s) of any variations being measured by the RF sensors.

To address this issue, according to an embodiment, at least one non-plasma discharge (NPD) recipe is run as a diagnostic test on the just-assembled plasma chamber 10. A NPD recipe operates the plasma chamber 10 with settings (e.g., low RF power and low chamber pressures) at which no plasma ignition/discharge occurs. RF sensor readings and measurement of electrical parameters of the chamber during NPD recipe runs have been found to be significantly less sensitive to chamber conditions and other outside variations outside of the RF delivery system.

Under NPD conditions, the RF match networks (matching network 40 and matching network 60) can tune to chamber hardware without striking a discharge. As match tuning to chamber hardware occurs during NPD runs, various capacitors in the RF match network move/adjust such that impedance (Z) of the match is the complex conjugate of RF hardware impedance. Using a resulting map of capacitor position versus impedance for a given match, the RF hardware impedance can be calculated via a non-linear model. Likewise, match efficiency/losses can be calculated via a similar model. Once impedance (Z) of the hardware in the RF path and match losses are found, the actual power delivered to plasma of the plasma chamber 10 can be determined using the following equation (Equation 1):

$$P_{plasma} = \eta_{match} P_{Gen} - (I^2 \times R_{HW})$$ (Equation 1)

where $P_{plasma}$ is the power actually delivered to the plasma, $\eta_{match}$ is the efficiency of match at the operating capacitor location(s), $P_{Gen}$ is the power output by RF power generator, I is the current through the RF pathway, and $R_{HW}$ is the resistance of the hardware in the RF pathway (e.g., those components between measurement points 80a and 80b in FIG. 1). The term ($I^2 \times R_{HW}$) corresponds to the power dissipated by the hardware in the RF pathway of chamber between the measurement points 80a and 80b. The value $\eta_{match}$ can be collected offline for various capacitor positions of the match system using appropriately designed equipment. For example, $\eta_{match}$ may be supplied by a supplier or vendor of the RF power generator(s) in some instances. $P_{Gen}$ is either a setting of the RF generator or a measurement taken at points 80a and 80b. $R_{HW}$ is a value estimated for a particular plasma chamber 10 on the basis of information obtained via the running of the NPD recipe(s) as explained above. In particular, capacitor positions of the match network of the plasma chamber 10 obtained in the NPD diagnostic tests correspond to the complex conjugate of the impedance (Z) of the hardware in the RF pathway as a terminating load, permitting $R_{HW}$ to be calculated/estimated therefrom.

FIG. 3 depicts aspects of a method 300 for determining actual RF power delivered to the plasma of a plasma chamber according to an embodiment of the present disclosure. Once determined, the actual RF power delivered to the plasma of a given plasma chamber 10 can be used for matching the processing performance of the given plasma chamber 10 to another plasma chamber 10 that has been similarly characterized using method 300 or the like.

According to method 300, in aspect 310 at least one NPD recipe is established for a plasma chamber 10. For example, in an NPD recipe, the RF power setting for the plasma chamber 10 may be between 0 watts (W) and 100 watts (W) with the chamber under high vacuum conditions without intentional inflows of gases. In an example embodiment, at least three different NPD recipes are established. In a first recipe, the source (SRC) generator power setting is scanned between 0 W and 100 W in 10 W increments with no gas inflows. In a second recipe, an electrode of the plasma chamber 10 (e.g., upper electrode 35) is operated in different modes and/or with various settings. For example, the power split between outer coil 36 and inner coil 37 can be varied between 0% and 100% to the outer coil 36 (or vice versa). Similarly, the direction of currents in the two coils can be switched such that current in the inner coil 37 travels in a direction opposite the outer coil 36. A third recipe, in which the bias supplied to the workpiece support 25 is varied under NPD conditions, can also be established.

In aspect 320, the plasma chamber match network is tuned during the running of at least one NPD recipe. As discussed above, the resultant parameters of the match network settings can be used to calculate the impedance of the plasma chamber 10 hardware (aspect 330). The match losses for the plasma chamber 10 can be similarly calculated from the match network settings (aspect 340). Using Equation 1, the actual power delivered to the plasma of the particular plasma chamber 10 is calculated or estimated (aspect 350). According to the calculated/estimated actual power delivered at a particular RF power setting, the RF power set point for the plasma chamber can be (optionally) adjusted (aspect 360; optional) to provide a performance match to another plasma chamber previously characterized according to method 300 or otherwise characterized similarly to method 300.

Methods of Identifying Specific Hardware Faults in Plasma Chambers

Figure 4:
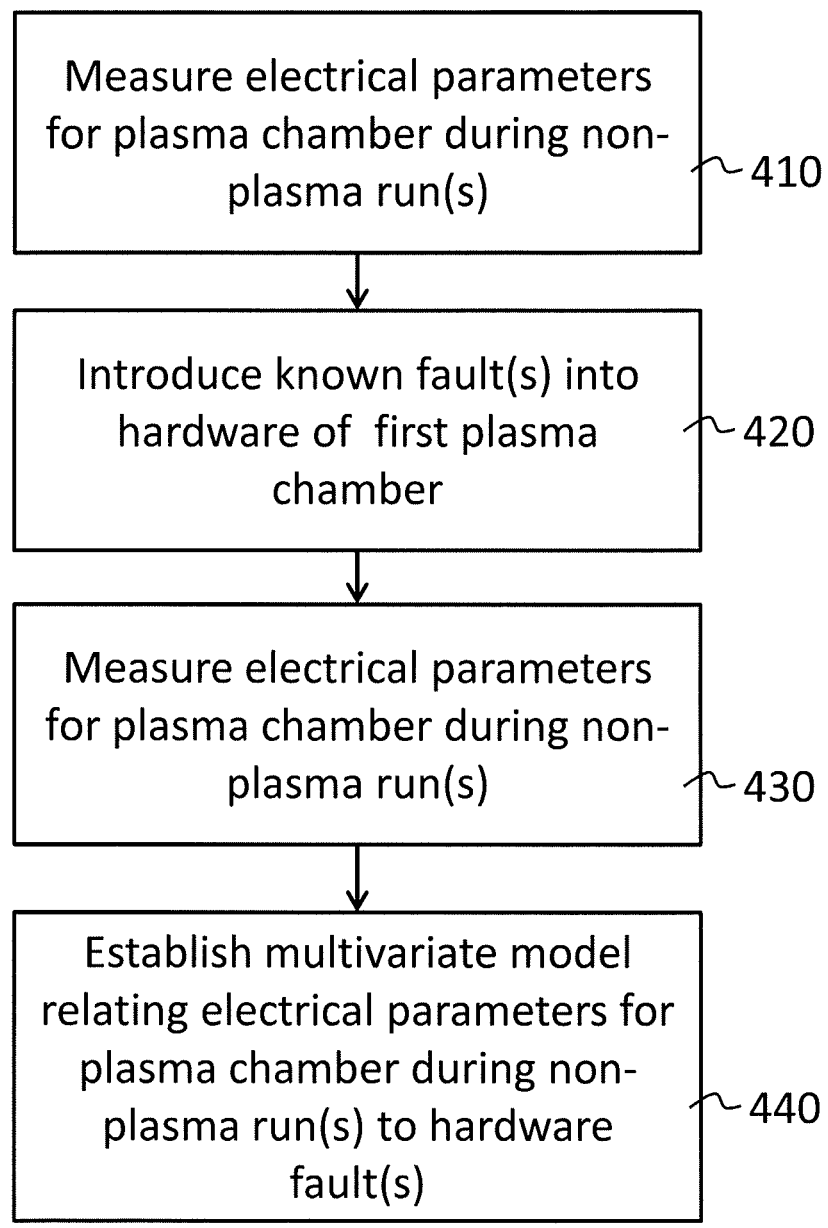
FIG. 4 depicts aspects of a method for identifying specific hardware faults in a plasma processing tool according to an embodiment.

FIG. 4 depicts aspects of a method 400 for identifying specific hardware faults in plasma chamber 10 using electrical parameters obtained during NPD tests. In aspect 410, electrical parameters (e.g., match network settings and/or calculated actual power delivery as voltage/current/phase parameters) are measured during one or more NPD run(s). The recipe(s) used in the NPD run(s) are similar to those described in conjunction with aspect 310 in method 300. The measurements obtained in aspect 410 are used to establish a baseline operation and thus it may be preferred for the plasma chamber 10 evaluated at this time to have been previously qualified and evaluated as normally operating.

After the baseline operation is established, a known "fault" is introduced into the hardware of plasma chamber 10 (aspect 420). For example, the introduced fault could be an out of specification inner coil 37, a loosened screw or fastener attaching a connector to a portion of the top electrode 35, improper spacing between hardware components, or, in general, anything which may be or become faulty in an assembled plasma chamber 10.

In aspect 430, the NPD runs, or some subset, used in aspect 410 are repeated on the now "faulty" plasma chamber 10 and electrical parameters are again measured during these NPD runs. Aspects 420 and 430 may be repeated for various known "faults."

In aspect 440, the collected electrical parameters are then used to establish a multivariate model that relates the measured electrical parameters during NPD diagnostic runs to the specifically introduce "fault." The established multivariate model resulting from method 400 can then be used to evaluate performance of other plasma chambers 10 having substantially the same design as the evaluated/modelled plasma chamber 10. Electrical parameters for these other plasma chambers 10 are collected during NPD diagnostic runs similar to those used in establishing the model. Comparison of the collected electrical parameters to the model expectations are then used to identify one or more specific faults in these other plasma chambers 10.

Methods of Assembling Plasma Processing Tools

Figure 5:
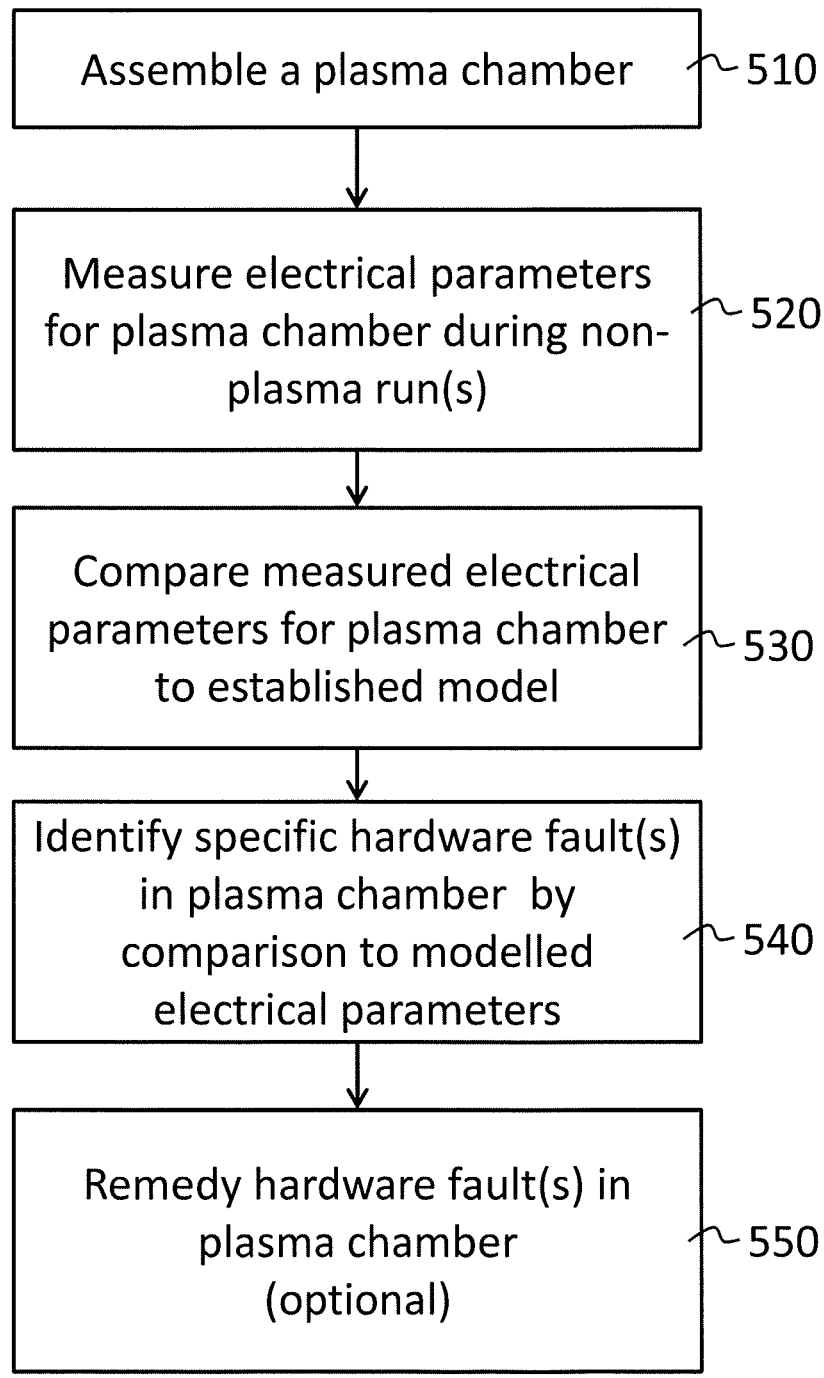
FIG. 5 depicts aspects of a method of assembling a plasma processing tool according to an embodiment.

FIG. 5 depicts aspects of a method 500 of assembling a plasma processing chamber 10 according to an embodiment of the present disclosure. In general, method 500 relies on NPD recipe(s) similar to those described in conjunction with aspect 310 of method 300 and a multivariate model similar to that established via method 400.

In aspect 510, a plasma chamber 10 is assembled. This may be an initial assembly at a manufacturing site, a reassembly at a customer site after initial manufacture, or a reassembly after a maintenance event after some period of service. The assembled plasma chamber 10 is then operated using at least one NPD recipe. The electrical parameters of the plasma chamber 10 during the NPD recipe run(s) are measured (aspect 520).

In aspect 530, the electrical parameters obtained during aspect 520 are then compared to a previously established multivariate model (such as the model resulting from method 400) that correlates values of electrical parameters of particular plasma chambers 10 obtained during NPD runs to specific hardware faults that might be present in the just-assembled plasma chamber 10. The specific hardware fault(s) in the just-assembled plasma chamber 10 can be identified by the comparison to model expected values (aspect 540). The identified fault(s) can then be (optionally) remedied (aspect 550, optional).

Other Example Implementations

In addition to above described examples, the present disclosure contemplates the storage, or incorporation via software or otherwise, of one or more NPD recipes in a multi-chamber-type apparatus such as apparatus 100. An apparatus 100 can be specifically configured to perform automated calibration of RF power settings for each chamber 130 according to method 300 (or the like, for example, just aspects 320 to 350) being performed on each chamber 130 to provide chamber-to-chamber performance matching for the apparatus 100.

Likewise, it is contemplated that controller 70 of a plasma chamber 10 can be specifically configured, via software or otherwise, to perform method 300 (or the like, for example, just aspects 320 to 350). Similarly, it is contemplated that a controller 70 of a plasma chamber 10 can be specifically configured, via software or otherwise, to perform at least some aspects of method 500, for example, aspects 520 to 540.

In this context, the workpieces/substrates processed in plasma chambers, such as plasma chamber 10, are typically silicon, or more broadly semiconductor, wafers, but this disclosure is not limited thereto and the material, shape, and/or size of the processed substrates in plasma chambers according to embodiments of the present disclosure is not a limitation.

What is claimed is:

1. A method of operating a plasma chamber, comprising:
  tuning a match network of a first plasma chamber while running a non-plasma discharge recipe in the first plasma chamber;
  calculating a hardware impedance of the first plasma chamber according to match network settings set in the tuning;
  calculating a match loss for the first plasma chamber according to match network settings set in the tuning; and
  setting a radio frequency (RF) power setting of the first plasma chamber according to the calculated hardware impedance and the calculated match loss.

2. The method of claim 1, further comprising:
  establishing the non-plasma discharge recipe for the first plasma chamber.

3. The method of claim 1, further comprising:
  calculating a value for actual power delivered to a plasma of the first plasma chamber using the calculated hardware impedance and the calculated match loss.

4. The method of claim 3, wherein the RF power setting of the first plasma chamber set according to the calculated hardware impedance and the calculated match loss is set such that the value for the actual power delivered to the plasma of the first plasma chamber is equal to a value of an actual power delivered to a plasma of a second plasma chamber.

5. The method of claim 4, wherein the first plasma chamber and the second plasma chamber are components of a multi-chamber processing tool.

6. The method of claim 1, wherein the RF power setting of the first plasma chamber set according to the calculated hardware impedance and the calculated match loss is set such that actual power delivered to the plasma of the first plasma chamber is equal to an actual power delivered to a plasma of a second plasma chamber.

7. The method of claim 6, wherein the first plasma chamber and the second plasma chamber are components of a multi-chamber processing tool.

8. The method of claim 1, further comprising:
  obtaining a map of capacitor positions in the match network after the tuning.

9. The method of claim 1, wherein the first plasma chamber is unseasoned when the non-plasma discharge recipe is run for the tuning of the matching network.

10. A method of operating a plasma chamber, comprising:
  measuring electrical parameters of a first plasma chamber while running a non-plasma discharge recipe to establish a baseline operating state of the first plasma chamber;
  introducing a known fault in hardware of the first plasma chamber;
  measure electrical parameters of the first plasma chamber after introduction of the known fault while running the non-plasma discharge recipe to establish a known fault operating state of the first plasma chamber; and comparing measured electrical parameters of the baseline operating state to measured electrical parameters of the known fault operating state and establishing a model correlating measured electrical parameters to the known fault operating state.

11. The method of claim 10, wherein the electrical parameters of the first plasma chamber are match network settings for the first plasma chamber set during a impedance match tuning of the first plasma chamber during the running of the non-plasma discharge recipe.

12. The method of claim 11, wherein the match network settings include capacitor positions within the match network.

13. The method of claim 10, further comprising:
measuring electrical parameters of the first plasma chamber while running a plurality of non-plasma discharge recipes to establish the baseline operating state of the first plasma chamber; and
measuring electrical parameters of the first plasma chamber while running the same plurality of non-plasma discharge recipes to establish the known fault operating state of the first plasma chamber.

14. The method of claim 10, wherein the non-plasma discharge recipe varies at least one of source electrode power, RF coil operating mode, and cathode bias.

15. The method of claim 10, further comprising:
measuring electrical parameters of a second plasma chamber while running the non-plasma discharge recipe;
comparing the measured electrical parameters of the second plasma chamber to the model correlating measured electrical parameters to the known fault operating state; and
identifying whether hardware of the second plasma chamber has the known fault by reference to the model.

16. A method of assembling a plasma chamber, comprising:
obtaining a multivariate model correlating measured electrical parameters of a first plasma chamber running a non-plasma discharge recipe to hardware faults in the first plasma chamber;
assembling a second plasma chamber;
measuring electrical parameters of the second plasma chamber while running at least one non-plasma discharge recipe; and
comparing the measured electrical parameters of the second plasma chamber to output of the multivariate model and identifying a hardware fault in the second plasma chamber according to the comparison.

17. The method of claim 16, further comprising:
fixing the identified hardware fault in the second plasma chamber.

18. The method of claim 16, wherein the multivariate model is obtained by a process including:
measuring electrical parameters of the first plasma chamber while running a series of non-plasma discharge recipes to establish a baseline operating state of the first plasma chamber;
introducing a known fault in hardware of the first plasma chamber;
measuring electrical parameters of the first plasma chamber after introduction of the known fault while running the series of non-plasma discharge recipes to establish a known fault operating state of the first plasma chamber; and
comparing measured electrical parameters of the baseline operating state to measured electrical parameters of the known fault operating state and correlating measured electrical parameters to the known fault operating state.

19. The method of claim 16, wherein the non-plasma discharge recipe varies at least one of source electrode power, RF coil operating mode, and cathode bias.

20. The method of claim 16, wherein the measured electrical parameters of the first plasma chamber are capacitor positions in a match network of the first plasma chamber set during a tuning of the match network during the running of the non-plasma discharge recipe.

* * * * *